United States Patent
Cohen et al.

(10) Patent No.: US 8,248,106 B1
(45) Date of Patent: Aug. 21, 2012

(54) LOCK DETECTION USING A DIGITAL PHASE ERROR MESSAGE

(75) Inventors: Hanan Cohen, San Diego, CA (US); Simon Pang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 169 days.

(21) Appl. No.: 12/949,427

(22) Filed: Nov. 18, 2010

Related U.S. Application Data

(63) Continuation-in-part of application No. 12/899,500, filed on Oct. 6, 2010, which is a continuation-in-part of application No. 12/841,131, filed on Jul. 21, 2010, now Pat. No. 8,106,808.

(51) Int. Cl.
 *G01R 23/02* (2006.01)
(52) U.S. Cl. .......................................... 327/47; 327/156
(58) Field of Classification Search .................. None
 See application file for complete search history.

(56) References Cited

U.S. PATENT DOCUMENTS

| | | | | |
|---|---|---|---|---|
| 6,734,748 B2 * | 5/2004 | Livezey | ........................ | 331/158 |
| 6,831,523 B1 * | 12/2004 | Pastorello et al. | ............... | 331/25 |
| 7,030,711 B2 * | 4/2006 | Steinbach et al. | ............ | 331/179 |
| 7,149,270 B2 * | 12/2006 | Dorschky et al. | ............. | 375/376 |
| 7,561,645 B2 * | 7/2009 | Stuart et al. | .................... | 375/347 |
| 7,999,584 B2 * | 8/2011 | Rhee et al. | ..................... | 327/156 |
| 8,059,774 B2 * | 11/2011 | Kong et al. | ................... | 375/354 |
| 8,106,808 B1 * | 1/2012 | Cohen et al. | ................... | 341/166 |
| 2004/0017263 A1 * | 1/2004 | Livezey | ........................ | 331/158 |
| 2004/0090277 A1 | 5/2004 | Tsyrganovich | | |
| 2004/0263225 A1 * | 12/2004 | Perrott et al. | ................. | 327/156 |
| 2005/0162552 A1 | 7/2005 | Xiu et al. | | |
| 2006/0159211 A1 | 7/2006 | Lin | | |
| 2006/0171495 A1 | 8/2006 | Youssouflan | | |
| 2006/0215778 A1 * | 9/2006 | Murthy et al. | ................ | 375/260 |
| 2006/0285619 A1 | 12/2006 | Watanabe | | |
| 2007/0188244 A1 | 8/2007 | Waheed | | |
| 2008/0012647 A1 | 1/2008 | Risbo et al. | | |
| 2008/0192877 A1 | 8/2008 | Eliezer et al. | | |
| 2008/0317187 A1 | 12/2008 | Waheed et al. | | |
| 2009/0086868 A1 | 4/2009 | Shiraishi et al. | | |
| 2009/0096535 A1 | 4/2009 | Chang | | |
| 2009/0096537 A1 | 4/2009 | Zhan et al. | | |
| 2009/0174492 A1 | 7/2009 | Zhang | | |
| 2009/0195277 A1 | 8/2009 | Yamakido et al. | | |
| 2009/0274255 A1 | 11/2009 | Li | | |
| 2010/0013531 A1 | 1/2010 | Ainspan et al. | | |
| 2010/0123493 A1 | 5/2010 | Griffiths | | |
| 2010/0271072 A1 | 10/2010 | Lee et al. | | |
| 2010/0277244 A1 | 11/2010 | Chang et al. | | |

* cited by examiner

*Primary Examiner* — Cassandra Cox
(74) *Attorney, Agent, or Firm* — Law Office of Gerald Maliszewski; Gerald Maliszewski

(57) ABSTRACT

A system and method are provided for frequency lock detection using a digital phase error. A lock detection module accepts a digital phase error (pherr) message proportional to an error in phase between a reference clock and a (synthesizer clock*Nf). Also accepted is a unitless frequency error tolerance value ($\Delta f$). The lock detection module periodically supplies a lock detect signal, indicating whether the synthesizer clock frequency is within the frequency error tolerance value of the reference clock frequency.

22 Claims, 11 Drawing Sheets

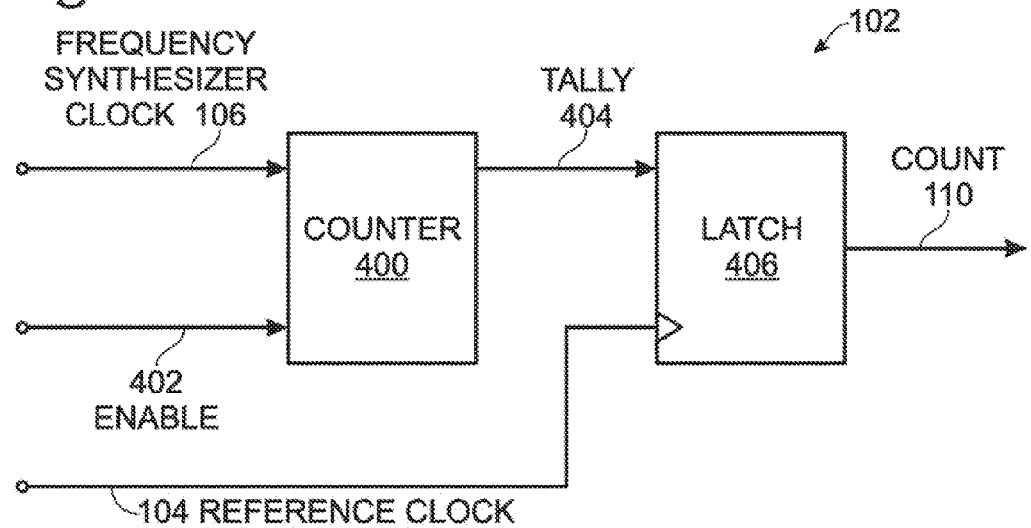
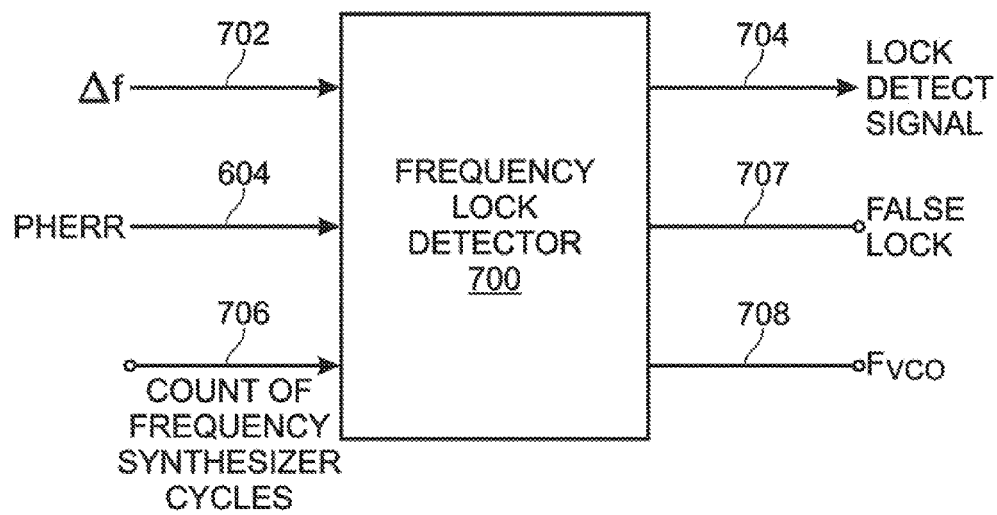

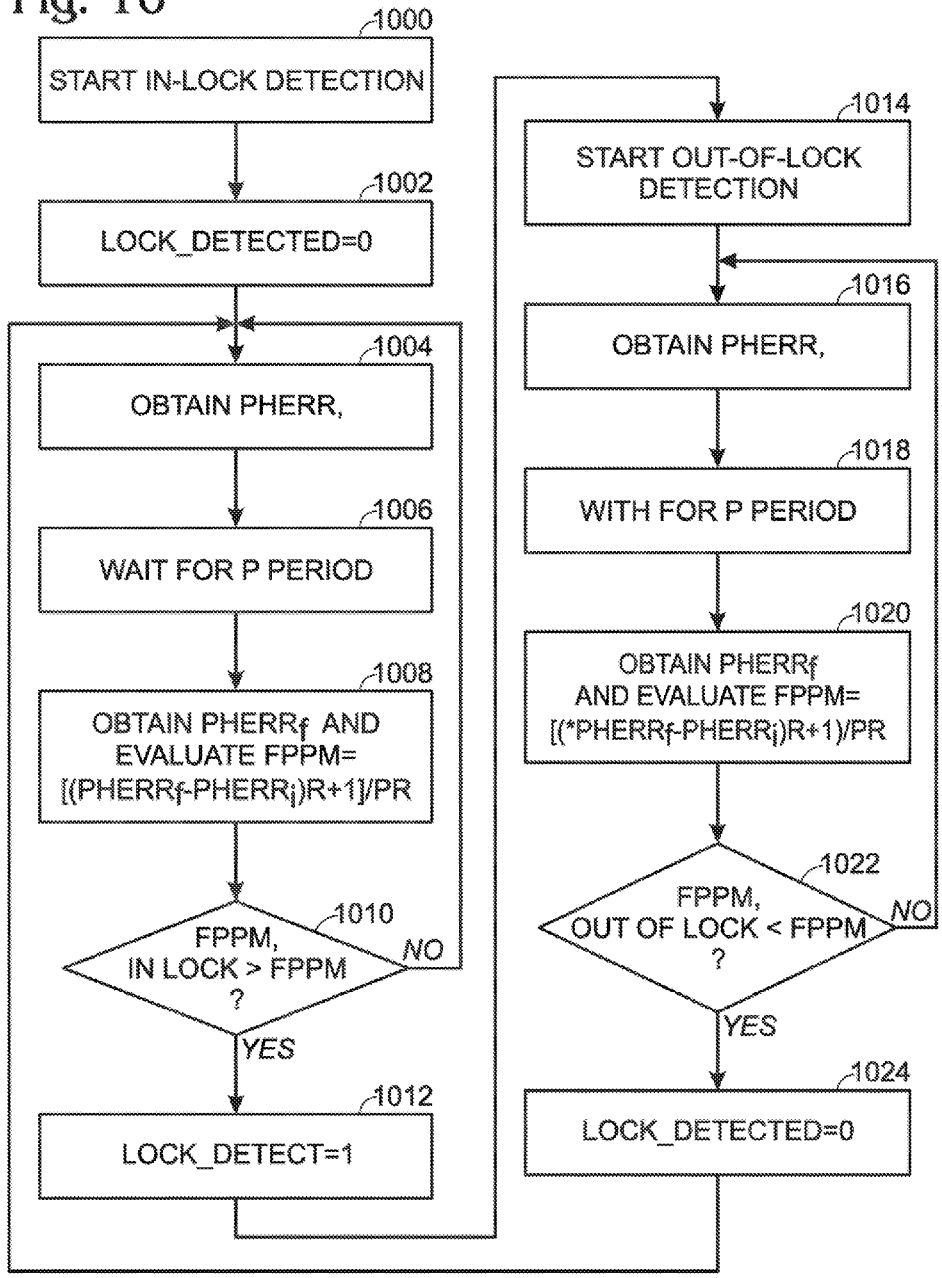

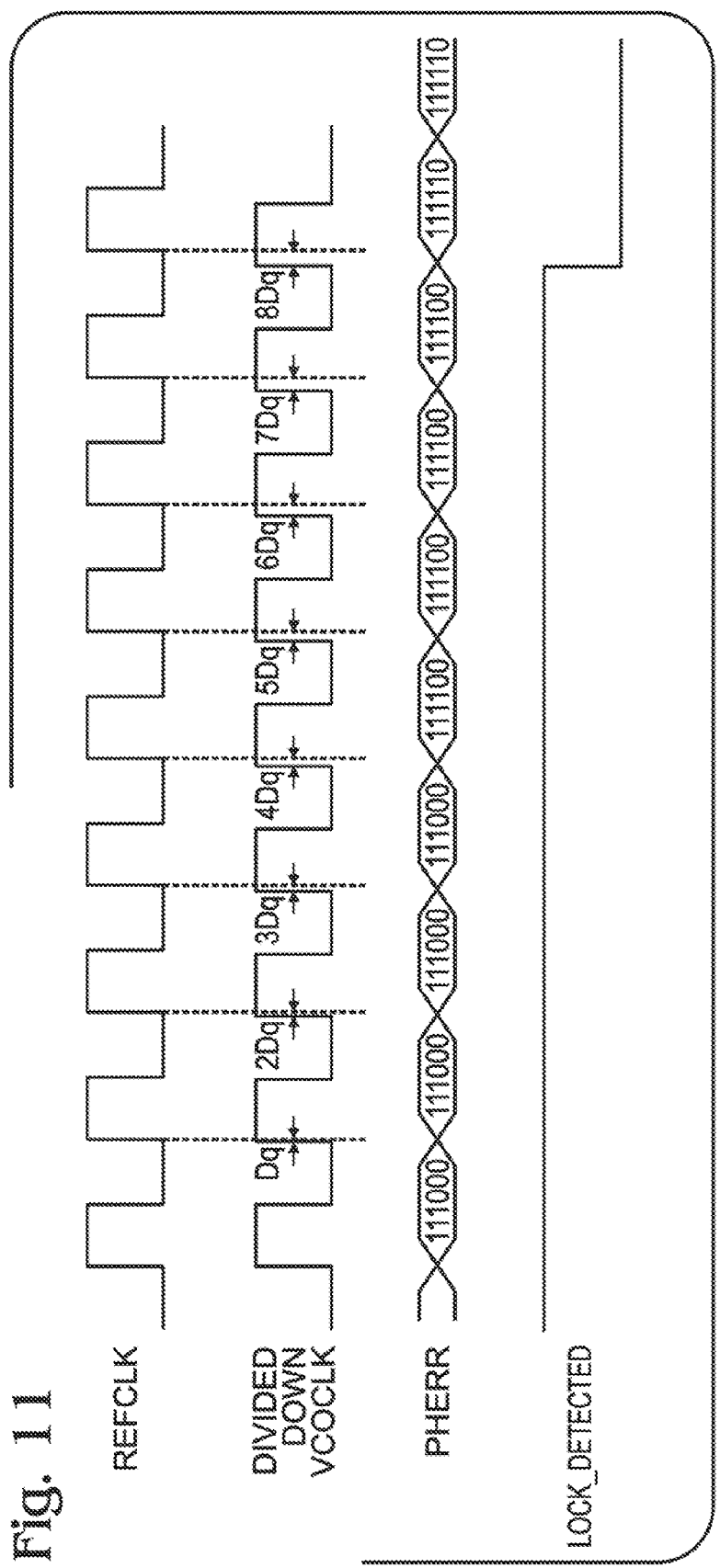

LOCK DETECTION USING A DIGITAL PHASE ERROR MESSAGE

RELATED APPLICATIONS

This application is a Continuation-in-Part of a pending patent application entitled, FREQUENCY INTEGRATOR WITH DIGITAL PHASE ERROR MESSAGE FOR PHASE-LOCKED LOOP APPLICATIONS, invented by Hanan Cohen et al, Ser. No. 12/899,500, filed Oct. 6, 2010:

which is a Continuation-in-Part of a pending patent application entitled, SUCCESSIVE TIME-TO-DIGITAL CONVERTER FOR A DIGITAL PHASE-LOCKED LOOP, invented by Hanan Cohen et al, Ser. No. 12/841,131, filed Jul. 21, 2010, now U.S. Pat. No. 8,106,808. Both these applications are incorporated herein by reference.

BACKGROUND OF THE INVENTION

1. Field of the Invention

This invention generally relates to digital communications and, more particularly, to a system and method for generating a frequency lock signal from a digital phase error message in phase-locked loop (PLL) applications.

2. Description of the Related Art

Digital PLLs (DPLLs) are an area of active research and development. A DPLL performs the loop filtering function in the digital domain with synthesized logic. DPLLs provide several advantages over the analog PLLs, including easier and faster implementation, and better controllability of the PLL parameters. Also, the integrated circuit (IC) die area devoted to the circuitry and power consumption can be greatly reduced, especially in advanced fabrication processes. Therefore, there is a growing interest in DPLLs for high performance applications.

FIG. 13 is a schematic block diagram of a fractional-N digital PLL (prior art). PLL clock synthesizers are ubiquitous in communication systems. Despite the popularity of the integer divider phase lock loop (PLL), fractional-N PLLs provide additional flexibility with the ratio of output clock frequency to reference clock frequency being a fraction rather than an integer. Conventional Fractional-N PLLs require a modulus divider, such that the average divide ratio of the feedback clock is a fraction, by modulating the divide ratio of a modulus divider. This divider modulation produces in-band modulation noise and requires PLL bandwidth to be low to filter out the in-band noise.

In a PLL based frequency synthesizer, the voltage controlled oscillator (VCO) clock is constantly compared with a reference clock. This comparison generates an error signal that is filtered and provided to the VCO, to correct the VCO frequency. In a charge pump PLL (CPPLL), a combination of phase/frequency detector (PFD) and charge pump perform phase error detection, and output an analog error signal. In DPLL, there is a need to convert this analog error signal to a digital error signal. One way of converting an analog signal to a digital signal is to utilize an analog-to-digital converter (A/D), but this approach requires additional power consumption and IC die area. A more practical approach would be to use a time-to-digital converter (TDC) to directly convert the phase offset to a digital error signal. A TDC can be used to digitize the duration of time between two events, usually represented by the edges of a signal. As described in more detail below, a TDC can be enabled with a delay line and sampling flip flops.

A key implementation challenge with the use of a TDC is the achievement a fine resolution error signal, in order to minimize the quantization noise effect on the PLL closed loop performance. However, a very fine resolution TDC usually has high power consumption, making it unattractive compared to conventional charge pump architecture. Therefore, a major challenge associated with a TDC is the tradeoff between resolution and power consumption. For example, a 155 megahertz (MHz) reference clock and 5 picoseconds (ps) of resolution require more than $2^{10}$ delay elements/samplers.

It would be advantageous if a low-power TDC architecture could be used in DPLLs. To that end, the parent application entitled, SUCCESSIVE TIME-TO-DIGITAL CONVERTER FOR A DIGITAL PHASE-LOCKED LOOP, invented by Hanan Cohen et al, Ser. No. 12/841,131, filed Jul. 21, 2010, provides a TDC to replace a conventional PFD/charge pump in an analog PLL system. The TDC compares a reference clock to a frequency synthesizer feedback clock, and generates a digital word that represents the phase offset between the two.

In a typical PLL, an internal oscillator is calibrated such that its frequency is exactly identical to an external reference times a ratio. A DPLL consists of an oscillator which can be digitally calibrated. A mechanism is needed to detect the proximity of the oscillator frequency with respect to a target frequency. This mechanism is called lock detection.

A conventional lock detect system in an analog PLL monitors the reference clock (refclk) and a divided down version of the VCO (vcoclk), and generates an indication on the locking status of the PLL. In a DPLL system, a divided down version of the VCO clock may not always be available. Adding a high speed divider just for lock monitoring however, increases power consumption, and therefore should be avoided in low power applications.

It would be advantageous if a digital phase error signal could be used to quickly determine if a synthesizer frequency source is locked to a reference frequency.

SUMMARY OF THE INVENTION

Disclosed herein are a system and method for converting a digital word, representing the phase offset between reference and phase-locked loop (PLL) synthesizer clocks, to a digital phase error word. A Successive Time to Digital Converter (STDC) processes the reference clock and frequency synthesizer clock, and generates a digital word representing the ratio of the two clock cycles, from which a digital representation of phase offset can be derived. The STDC is able to achieve comparable resolution to a conventional TDC with almost an order of magnitude fewer delay element/samplers. Furthermore, the STDC allows dynamic power management, which significantly reduces the power consumption. By improving the performance-to-power dissipation ratio of TDCs, the building of power efficient high performance digital PLLs is possible.

The combination of the digital phase error word and the STDC permit a divider-less fractional-N digital PLL to be built, requiring no divider modulation. By eliminating the noise associated with the sigma delta modulator, a low PLL bandwidth is not required for noise filtering. The high bandwidth supports wide bandwidth modulation and fast settling. While conventionally modulus PLLs create noise folding from high frequency to in-band, increasing the jitter of the output clock, the absence of modulation noise and nonlinearities associated with the claimed invention creates an output clock with lower phase noise and jitter.

A Time-to-Digital-Converter Based Frequency Lock Detector (TFLD) is an elegant approach to lock detection. Utilizing the TDC in a DPLL, the conventional counter based lock detect circuit can be replaced. The TDC processes an input reference clock and an internal (VCO) feedback clock, and a DSP (digital signal processor) processes the TDC outputs to generate a phase error. The TFLD uses the phase error output to produce a lock status signal. The FFLD utilizes TDC circuit already existing in the DPLL to achieve a faster convergence speed, more than 128 times faster than using a conventional counter. Further, the TFLD dies not require a high speed divider.

Accordingly, a method is provided for frequency lock detection using a digital phase error. A lock detection module accepts a digital phase error (pherr) message proportional to an error in phase between a reference clock and a (synthesizer clock*Nf). Also accepted is a unitless frequency error tolerance value ($\Delta f$). The lock detection module periodically supplies a lock detect signal, indicating whether the synthesizer clock frequency is within the frequency error tolerance value of the reference clock frequency. An in-lock detect signal is supplied if:

$$\Delta f > |pherr_f - pherr_i|/PTref;$$

where $pherr_f$ is a final pherr value;
where $pherr_i$ is an initial pherr value;
where P is a variable equal to an integer number of reference clock cycles; and,
where Tref is a period of a reference clock cycle.

The lock detect module supplies an out-of-lock detect signal if:

$$\Delta f < (|pherr_f - pherr_i| - (Tref/R))/PTref;$$

$$< (|pherr_f - pherr_i| R/Tref - 1)/PR.$$

In one aspect, the lock detection module supplies a synthesizer clock frequency (Fvco) as follows:

$$Fvco(NfP)/(PTref - (pherr_f - pherr_i)).$$

Additional details of the above-described method, a frequency lock detector, and a digital PLL with frequency lock detector are presented below.

BRIEF DESCRIPTION OF THE DRAWINGS

FIG. 4 is a schematic block diagram depicting an example of the frequency detector of FIG. 1 is greater detail.

FIG. 7 is a schematic block diagram of a frequency lock detector using a digital phase error.

FIG. 10 is an exemplary flowchart for a frequency lock detection process.

FIG. 11 is a diagram depicting waveforms associated with out-of-lock detection.

DETAILED DESCRIPTION

Figure 1:
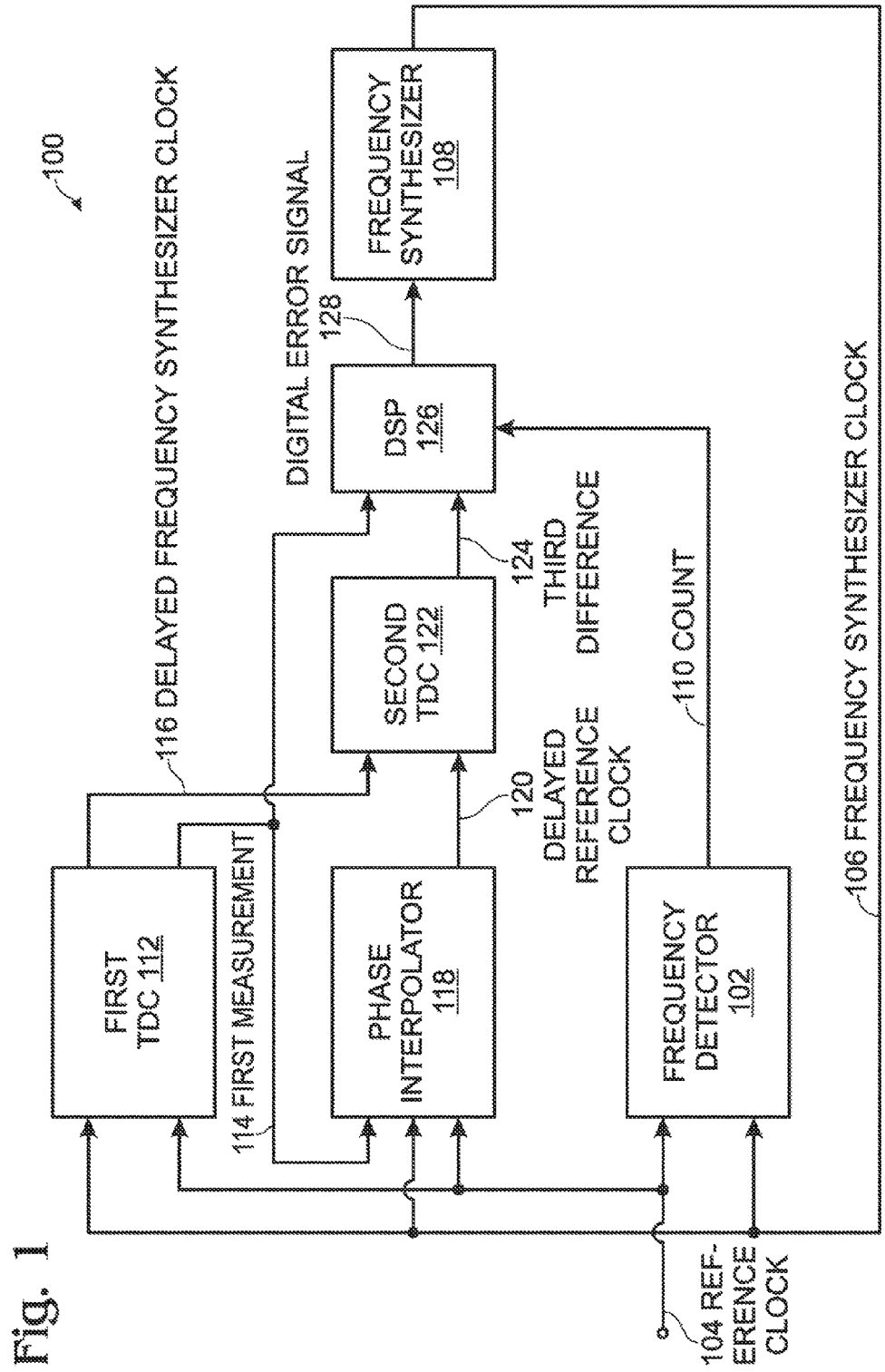
FIG. 1 is a schematic block diagram of a successive time-to-digital converter (STDC) and frequency synthesizer.

FIG. 1 is a schematic block diagram of a successive time-to-digital converter (STDC) and frequency synthesizer. The STDC 100 comprises a frequency detector 102 having an input on line 104 to accept a reference clock (REFCLK), and an input on line 106 to accept a frequency synthesizer clock (VCOCLK) from a frequency synthesizer 108. The frequency detector 102 has an output on line 110 to supply a count of the number of frequency synthesizer clock cycles per reference clock cycle (HSCNTROUT), also referred to as the count. A first TDC 112 has an input on line 104 to accept the reference clock, and an input on line 106 to accept the frequency synthesizer clock. The first TDC 112 measures a first difference between an edge of a reference clock period and a corresponding edge of a frequency synthesizer clock period, and provides the first difference measurement (CTDCOUT) at an output on line 114. The first TDC 112 also provides the frequency synthesizer clock delayed a full cycle (VCOCLK+$2\pi$) on line 116.

A phase interpolator 118 has an input on line 104 to accept the reference clock, an input on line 106 to accept the frequency synthesizer clock, and an input on line 114 to accept the first difference measurement. The phase interpolator 118 supplies the reference clock on line 120 delayed to create a second difference (REFCLK+$\Phi_X$) between the edge of the delayed reference clock period and the corresponding edge of the frequency synthesizer clock period, where the second difference is less than the first difference.

A second TDC 122 has an input on line 120 to accept the delayed reference clock period, and input on line 116 to accept the delayed frequency synthesizer clock. The second TDC 122 measures a third difference (FTDCOUT) between the edge of the delayed reference clock period and the corresponding edge of the delayed frequency synthesizer clock period, and provides the third difference measurement as a time duration on line 124. A digital signal processor (DSP) 126 has an input on line 124 to accept the third difference measurement, an input on line 114 to accept the first difference measurement, and an input on line 110 to accept the count from the frequency detector. The DSP 126 has an output on line 128 to supply a digital error signal (tdcOUT).

Figure 2:
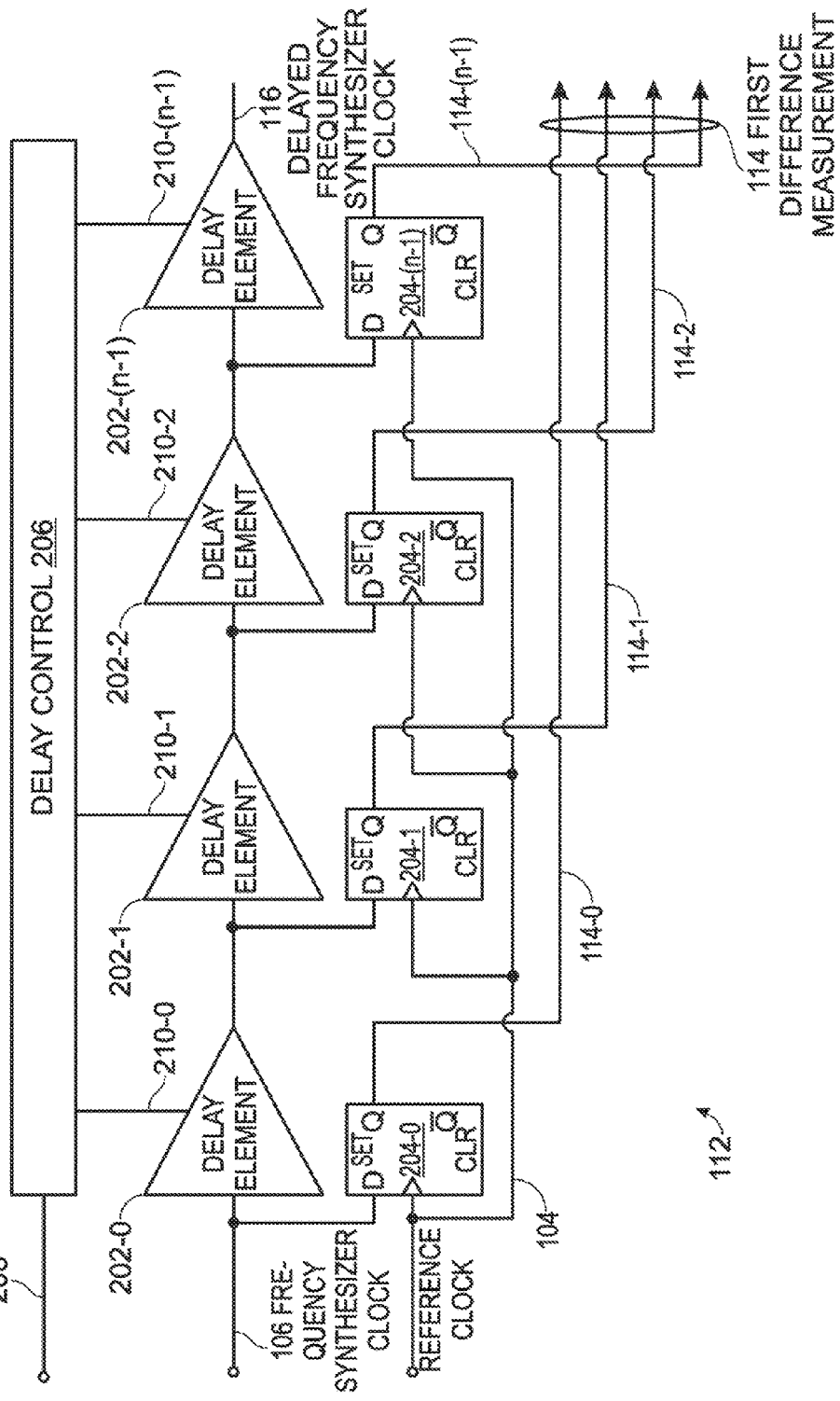
FIG. 2 is a schematic block diagram depicting a detailed example of the first TDC of FIG. 1.

FIG. 2 is a schematic block diagram depicting a detailed example of the first TDC of FIG. 1. In one aspect, the first TDC 112 supplies the first difference measurement as a digital word representing the relationship between the edge of the reference clock and a phase of the frequency synthesizer clock. As shown in this example, the first TDC 112 includes n serially connected delay circuits 202-0 through 202-(n-1) accepting the frequency synthesizer clock on line 106, and supplying n frequency synthesizer clock phases on line 106 (no delay), 200-0, 200-1, and 200-(n-1). In this example, n=4, but the TDC is not limited to any particular value. Also shown are n latches 204-0 through 204-(n-1). Each latch 204 has a signal input connected to receive a corresponding frequency synthesizer clock phase. Each latch 204 also has a clock input connected to receive the reference clock on line 104, and an output on line 114 to supply a corresponding bit in an n-bit first difference measurement signal.

Also shown is a delay control element 206 accepting a DLL control signal on line 208 from the DSP (not shown in FIG. 1). The delay control element 206 is able to control the delay through delay elements 202 with signals on lines 210-0 through 210-(n-1), in response to the DLL control signal. As used herein, delay coverage is the maximum period of time that a TDC can process. The time period beyond the delay coverage cannot be distinguished by the TDC. Typically, the delay coverage is the total delay of the delay chain. Resolution is the TDC step size as a time duration measurement, and dynamic range is the ratio of delay coverage to resolution. These variables may be set with the DLL control signal.

It should be noted that a number of TDC designs are known in the art, and that the first TDC of FIG. 1 can be enabled using designs other than the example depicted in FIG. 2.

Figure 3:
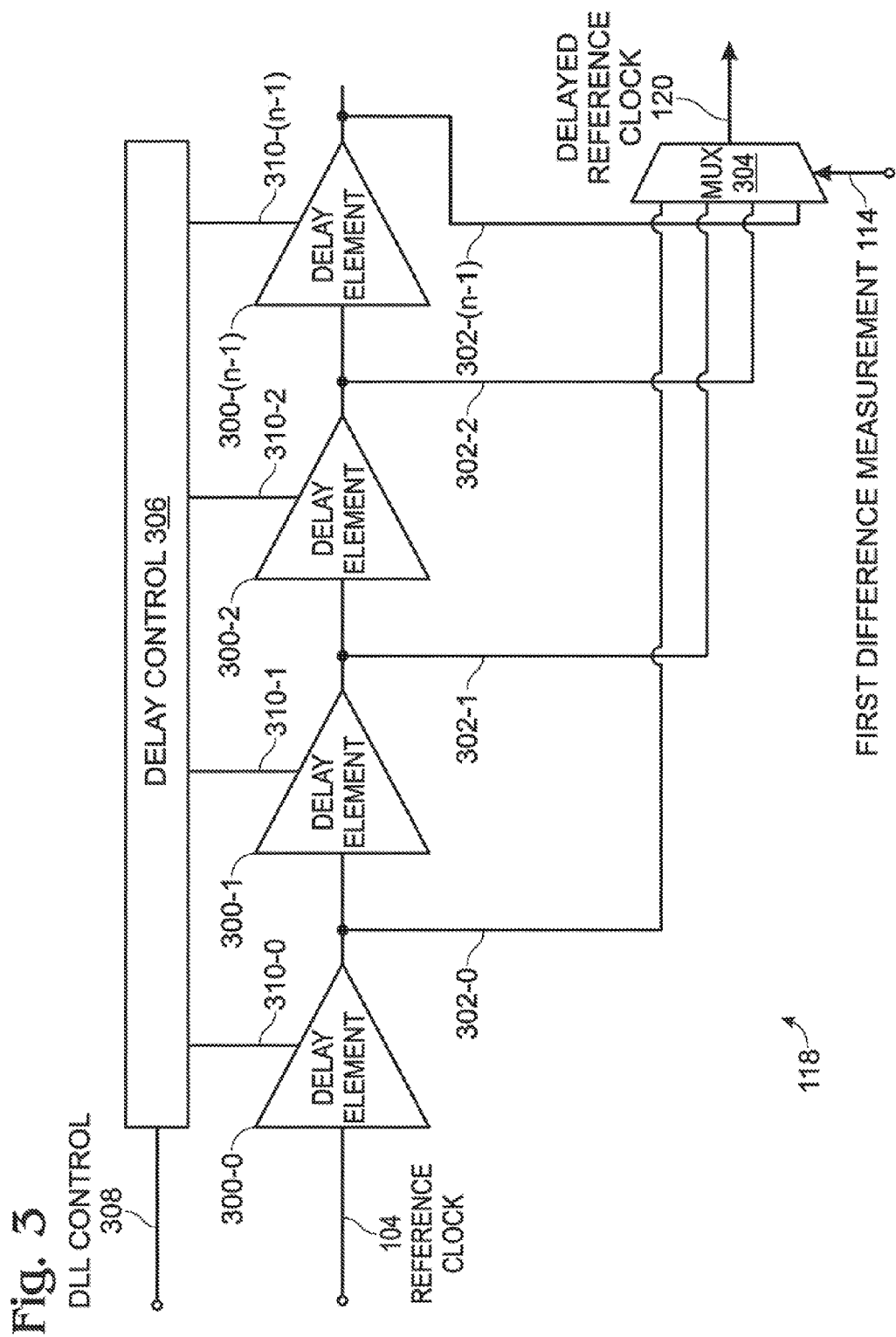
FIG. 3 is a schematic block diagram depicting a detailed example of the phase interpolator of FIG. 1.

FIG. 3 is a schematic block diagram depicting a detailed example of the phase interpolator of FIG. 1. As shown, n serially connected delay circuits 300-0 through 300-(n−1) accept the reference clock on line 104, and supply n reference clock phases on 302-0, 302-1, 302-2, and 302-(n−1). In this example n=4, but the phase interpolator is not limited to any particular value. A multiplexer (MUX) 304 has signal inputs on lines 302-0, 302-1, 302-2, and 302-(n−1) to accept the n reference clock phases and a control input on line 114 to accept the first difference measurement.

Also shown is a delay control element 306 accepting a DLL control signal on line 308 from the DSP (not shown in FIG. 1). The delay control element 306 is able to control the delay through delay elements 300 with signals on lines 310-0 through 310-(n−1), in response to the DLL control signal. It should be noted that a number of TDC designs are known in the art, and that the phase interpolator of FIG. 1 can be enabled using designs other than the example depicted in FIG. 3.

FIG. 4 is a schematic block diagram depicting an example of the frequency detector of FIG. 1 is greater detail. In this example, the frequency detector 102 includes a counter 400 having an input to accept the frequency synthesizer clock on line 106, an input to accept an enable signal from the DSP on line 402, and an output to supply a tally (COUNTVAL) on line 404, triggered by the enable signal. A latch 406 has a signal input to accept the tally on line 404, and clock input connected to receive the reference clock on line 104, and an output to supply the count of the number of frequency synthesizer clock cycles per reference clock cycle on line 110. Other means of sampling the number of frequency synthesizer clock cycles per reference clock cycle are known in the art that would enable the frequency counter of FIG. 1.

Figure 5:
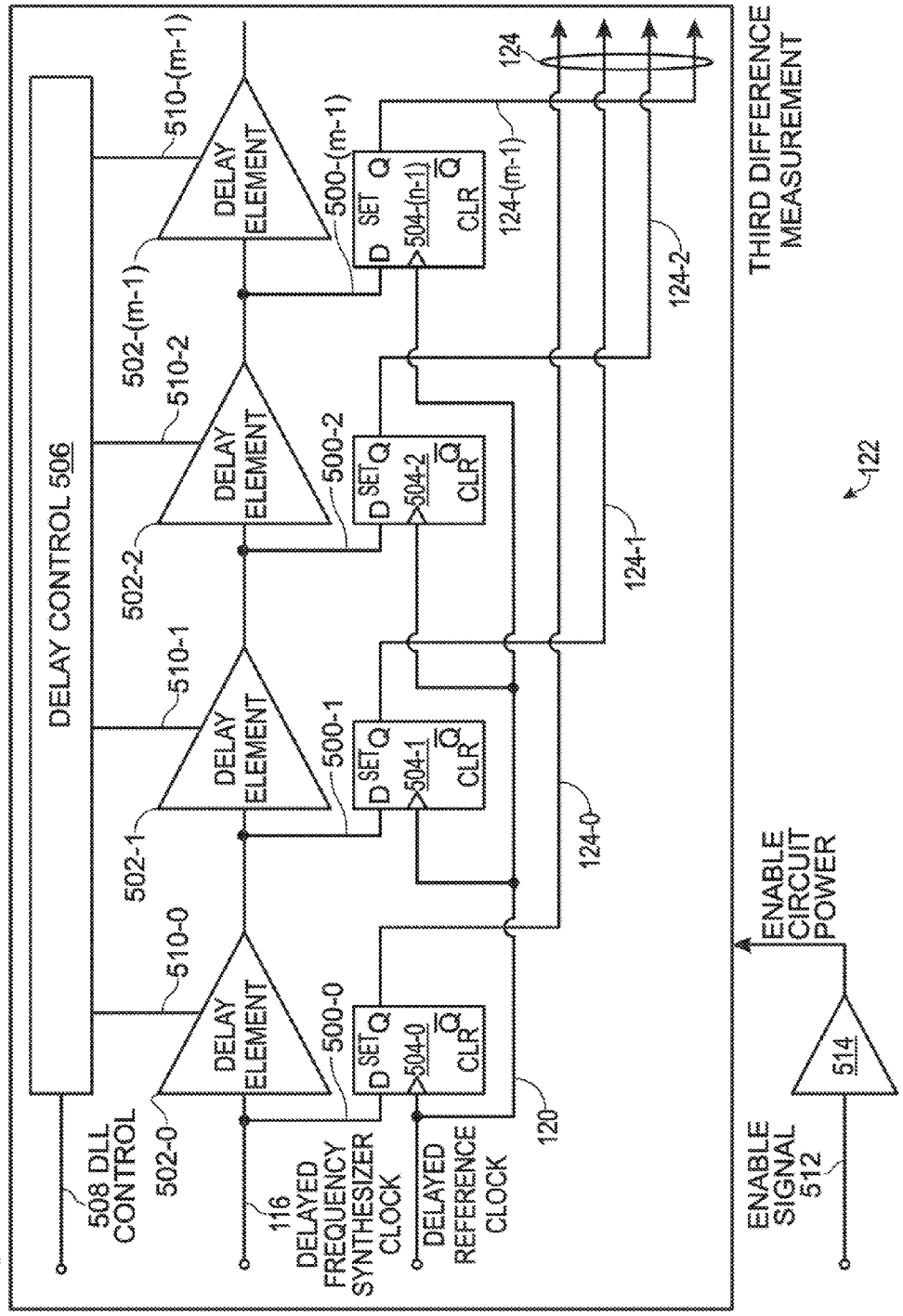
FIG. 5 is a schematic block diagram depicting a detailed example of the second TDC of FIG. 1.

FIG. 5 is a schematic block diagram depicting a detailed example of the second TDC of FIG. 1. In one aspect, the second TDC 122 supplies the third difference measurement as a digital word on line 124, representing the relationship between the edge of the delayed reference clock and a phase of the delayed frequency synthesizer clock. As shown in this example, the second TDC 122 includes m serially connected delay circuits 502-0 through 502-(m−1) to accept the delayed frequency synthesizer clock on line 116, and supplying m phases of the delayed frequency synthesizer clock on line 116 (500-0), 500-1, 500-2, and 500-(m−1). In this example, m=4, but the TDC is not limited to any particular value. Neither is there any particular relationship between the value of m and the value of n. Also shown are m latches 504-0 through 504-(m−1). Each latch 504 has a signal input connected to receive a corresponding phase of the delayed frequency synthesizer clock. Each latch 504 also has a clock input connected to receive the delayed reference clock on line 120, and an output on line 124 to supply a corresponding bit in an m-bit third difference measurement signal.

Also shown is a delay control element 506 accepting a DLL control signal on line 508 from the DSP (not shown in FIG. 1). The delay control element 506 is able to control the delay through delay elements 502 with signals on lines 510-0 through 510-(m−1), in response to the DLL control signal. It should be noted that a number of TDC designs are known in the art, and that the second TDC of FIG. 1 can be enabled using designs other than the example depicted in FIG. 5.

In another aspect, the second TDC 122 is selectively enabled in response to a signal from the DSP on line 512. As shown, device 514 supplies power to the second TDC 122 on line 516 in response to the enable signal on line 512.

Figure 6:
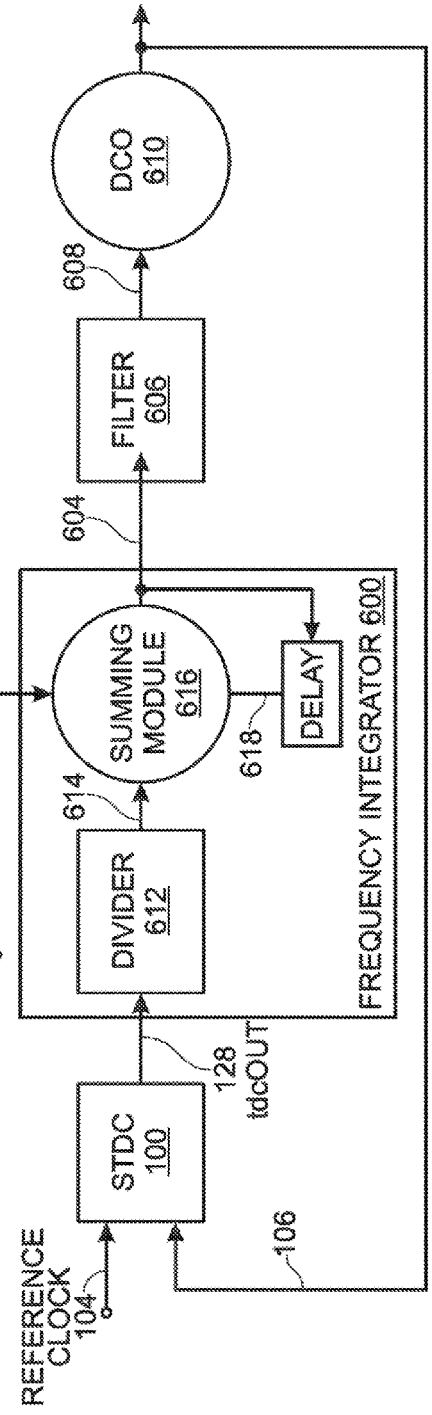
FIG. 6 is a schematic block diagram of a digital phase-locked loop (PLL).

FIG. 6 is a schematic block diagram of a digital phase-locked loop (PLL). The digital PLL (DPLL) 601 comprises a STDC 100 having an input on line 104 to accept a reference clock, an input on line 106 to accept a synthesizer clock from a frequency synthesizer, and an output on line 128 to periodically supply a digital tdcOUT message representing a measured ratio of the reference clock (Tref) period to the synthesizer clock (Tdco) period. Details of the STDC are presented above in the explanation of FIGS. 1 through 5.

A frequency integrator or digital frequency integrator 600 has a first input on line 128 to accept the tdcOUT messages, and a second input on line 602 to accept a digital message selecting a first ratio (Nf). The frequency integrator 600 has an output on line 604 to periodically supply a digital phase error (pherr) message proportional to an error in phase between reference clock and the (synthesizer clock*Nf). In one aspect, the STDC 100 supplies the tdcOUT message at a rate equal to the reference clock frequency, and the frequency integrator 600 supplies the pherr message at a rate equal to the reference clock frequency. In one aspect (not shown), the frequency integrator is enabled as part of the STDC DSP.

A digital loop filter 606 has an input on line 604 to accept the pherr message and an output on line 608 to periodically supply a digital control message. A digitally controlled oscillator (DCO) 610 has an input on line 608 to accept the control messages and an output on line 106 to supply the synthesizer clock in response to the control messages. The frequency integrator 600 calculates a period difference (err) value as follows:

err[k]=Tdiv+err[k−1]−Tref;

where T div is the period of (synthesizer clock*Nf); and, where k is a time sequence value.

The frequency integrator 600 refines the calculation of the err value as follows:

$$\frac{err[k]}{Tref} = \frac{T_{div}}{Tref} + \frac{err[k-1]}{Tref} - 1$$

$$\frac{err[k]}{Tref} = \frac{Nf \times T_{dco}}{out[k] \times T_{dco}} + \frac{err[k-1]}{Tref} - 1$$

$$\frac{err[k]}{Tref} = \frac{Nf}{out[k]} + \frac{err[k-1]}{Tref} - 1$$

where out[k] = Tref / Tdco.

As a result, the frequency integrator supplies the pherr message as follows:

pherr[k]=err[k]/Tref;

pherr[k]=Nf/out[k]+pherr[k−1]−1;

pherr[k]=Nf(1/out[k])+pherr[k−1]/Nf−Nf.

The frequency integrator 600 includes a divider 612 to accept the tdcOUT messages on line 128 and to supply divided tdcOUT (1/tdcOUT) messages on line 614. A summing module 616 has inputs to accept the divided tdcOUT messages on line 614, the first ratio Nf on line 602, and a previous pherr message (pherr[k−1]) on line 618. The summing module 616 adds pherr[k−1] to the divided tdcOUT message and subtracts Nf, to supply a current period pherr message (pherr[k]) on line 604. A delay 620 has an input on line 604 to accept the current pherr message and an output to supply the previous pherr message on line 618 in a subsequent time period.

FIG. 7 is a schematic block diagram of a frequency lock detector using a digital phase error. The frequency lock detector 700 has a first input on line 604 to periodically accept a digital phase error (pherr) message proportional to an error in phase between a reference clock and a (synthesizer clock*Nf). Note: the synthesizer clock may also be referred to as a VCO clock or a DCO, depending on the explicit embodiment. Returning briefly to FIG. 6, the reference clock is supplied on line 104 and the synthesizer clock is supplied on line 106. The frequency lock detector 700 has a second input on line 702 to accept a unitless frequency error tolerance value (Δf). Note: the error tolerance value can also be accepted is units of phase, frequency, or time, and converted to Δf. The frequency lock detector 700 has an output on line 704 to periodically supply a lock detect signal, indicating whether the synthesizer clock frequency is within the frequency error tolerance value of the reference clock frequency. In one aspect, the frequency lock detector second input accepts a frequency error tolerance value (Δf) as follows:

$$\Delta f = (Fvco - Ftarget)/Ftarget;$$

where Ftarget=Nf/Tref.

In another aspect, the output on line 704 supplies an in-lock detect signal as follows:

$$\Delta f > |pherr_f - pherr_i|/PTref;$$

where $pherr_f$ is a final pherr value;
where $pherr_i$ is an initial pherr value;
where P is a variable equal to an integer number of reference clock cycles; and,
where Tref is a period of a reference clock cycle.

Typically, the frequency lock detector 700 first input on line 702 receives the pherr message with resolution uncertainty (Tref/R). Then, the output on line 704 supplies the in-lock detect signal as follows:

$$\Delta f > (|pherr_f - pherr_i| + (Tref/R))/PTref;$$

$$> (|pherr_f - pherr_i|R/Tref+1)/PR.$$

In another aspect, the frequency lock detector 700 output supplies an out-of-lock detect signal as follows:

$$\Delta f < (|pherr_f - pherr_i| - (Tref/R))/PTref;$$

$$< (|pherr_f - pherr_i|R/Tref-1)/PR.$$

Note: although not specifically described, the out-of-lock conditions can be expressed in terms of the resolution uncertainty Tref/R, as shown above for the in-lock conditions.

In one aspect, the frequency lock detector further comprises a third input on line 706 to receive a count of the number of frequency synthesizer clock cycles per reference clock cycle (HSCNTROUT). Returning briefly to FIG. 1, the HSCNTROUT signal is supplied on line 110). The frequency lock detector 700 determines a false lock condition if:

$$\Delta f > |pherr_f - pherr_i|/PTref;\text{ and,}$$

HSCNTROUT≠(Nf≠x), where x is a tolerance variable.

In another aspect, the frequency lock detector 700 further comprises a frequency output on line 708 to supply a synthesizer clock frequency (Fvco) as follows:

$$Fvco(NfP)/(PTref-(pherr_f-pherr_i)).$$

As explained in more detail below, the Fvco value is determined as a range of values, assuming a large value of P, where P is much greater than 1/R.

Contrasting FIGS. 6 and 7, the frequency lock detector 700 may further comprise a frequency integrator 600. Details of the frequency integrator as described above in the explanation of FIG. 6, and are not repeated here in the interest of brevity. As noted above, the frequency integrator 600 accepts a digital tdcOUT message from a Time-to-Digital Converter (TDC) representing a measured ratio of a reference clock (Tref) period to a synthesizer clock (Tdco) period. The frequency integrator also accepts a digital message selecting a first ratio (Nf), and has an output to supply the digital phase error (pherr) message on line 604 to the frequency lock detector 700.

Figure 8:
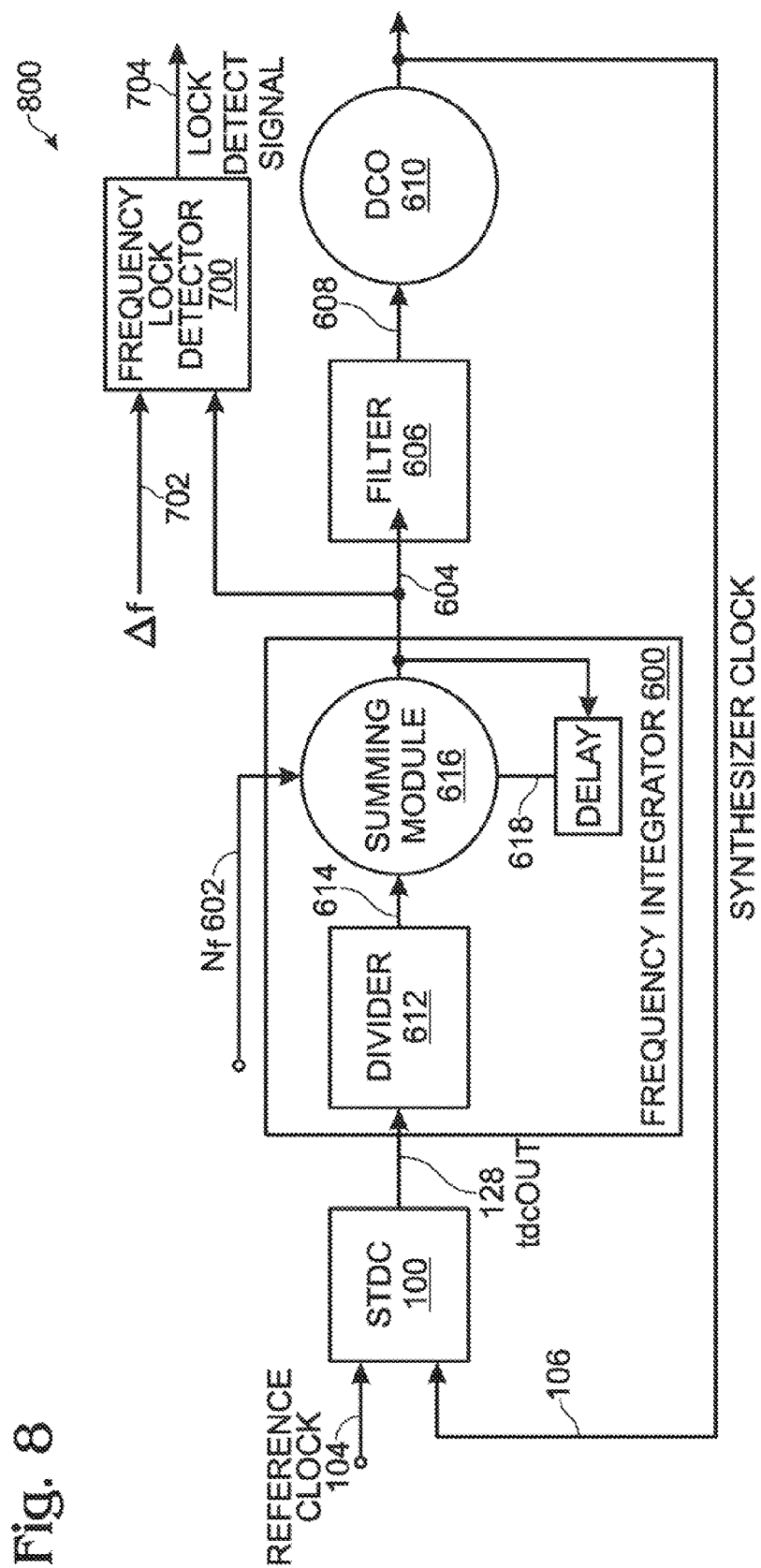
FIG. 8 is a schematic block diagram of a digital PLL (DPLL) with a frequency lock detector.

FIG. 8 is a schematic block diagram of a digital PLL (DPLL) with a frequency lock detector. The DPLL 800 comprises a successive time-to-digital converter (STDC) 100 having an input on line 106 to accept a synthesizer clock from a frequency synthesizer, and an output on line 128 to periodically supply a digital tdcOUT message representing a measured ratio of the reference clock (Tref) period to the synthesizer clock (Tdco) period. Details of the STDC are presented above in the explanation of FIGS. 1 through 5.

A frequency integrator or digital frequency integrator 600 has a first input on line 128 to accept the tdcOUT messages, and a second input on line 602 to accept a digital message selecting a first ratio (Nf). The frequency integrator 600 has an output on line 604 to periodically supply a digital phase error (pherr) message proportional to an error in phase between reference clock and the (synthesizer clock*Nf). Details of the frequency integrator are presented above in the explanation of FIG. 6.

A digital loop filter 606 has an input on line 604 to accept the pherr message and an output on line 608 to periodically supply a digital control message. A digitally controlled oscillator (DCO) or VCO 610 has an input on line 608 to accept the control messages and an output on line 106 to supply the synthesizer clock in response to the control messages.

As presented above in the explanation of FIG. 7, the frequency lock detector 700 has a first input on line 604 to periodically accept a digital phase error (pherr) message proportional to an error in phase between a reference clock and a (synthesizer clock*Nf). The frequency lock detector 700 has a second input on line 702 to accept a unitless frequency error tolerance value (Δf), an output on line 704 to periodically supply a lock detect signal, indicating whether the synthesizer clock frequency is within the frequency error tolerance value of the reference clock frequency. In some aspects, the frequency lock detector 700 and/or the frequency integrator 600 can be enabled in the STDC 100.

FUNCTIONAL DESCRIPTION

Definition of Terms $T_{ref}$: Period of Refclk;
$T_{dco}$ ($T_{vco}$): Period of DCO (VCO) output, dcoclk (vcoclk);
$N_F$: the desired dcoclk frequency divided by refclk frequency;
$F_{dco}$ ($F_{vco}$): Frequency of DCO (VCO);
$F_{ref}$: Frequency of refclk=1/Tref;
Divclk: a fictitious clock with instantaneous period equal to exactly $T_{dco} \times N_F$. This is equivalent to an output of a fractional divider.

Frequency Error can be expressed as:

$$\frac{\Delta f_{ppm}}{10^6} = \left| \frac{f_{ref} - \frac{f_{vco}}{N}}{f_{ref}} \right|$$

where is the frequency deviation of refclk ($f_{ref}$) to divided down vcoclk ($f_{vco}$), and N (or Nf) is the desired ratio of $f_{vco}$ to $f_{ref}$·N, which can be an integer or a fraction. The expression can also be approximated by clock period.

$$\frac{\Delta f_{ppm}}{10^6} = \frac{|T_{ref} - NT_{vco}|}{T_{ref}}$$

where $T_{ref}$ and $T_{vco}$ are the period of refclk and vcoclk, respectively.

Frequency Error in multiple refclk cycles: The quantity $T_{ref}$-$NT_{vco}$ can be defined as phase deviation $\Delta\theta$ which denotes the phase difference between refclk period and an ideal number of vcoclk cycles within each refclk period. Assuming a device that accumulates $\Delta\theta$ for P refclk cycles, the total phase error is $P(T_{ref}-NT_{vco})$ and frequency error can be expressed as:

$$\frac{\Delta f_{ppm}}{10^6} = \frac{|PT_{ref} - PNT_{vco}|}{PT_{ref}}$$

In-lock and out-of-lock criteria: For a lock detector to declare "in-lock" such that refclk and divided down vcoclk have a maximum frequency error of $\Delta f_{ppm,inlock}$, the following expression can be obtained:

$$\frac{\Delta f_{ppm, in\ lock}}{10^6} > \frac{|PT_{ref} - PNT_{vco}|}{PT_{ref}}$$

Similarly, for a lock detector to declare "out-of-lock", such that refclk and divided down vcoclk have a minimum frequency error of $\Delta f_{ppm,out\ of\ lock}$, the following expression can be obtained:

$$\frac{\Delta f_{ppm,out\ of\ lock}}{10^6} < \frac{|PT_{ref} - PNT_{vco}|}{PT_{ref}}$$

Figure 9:
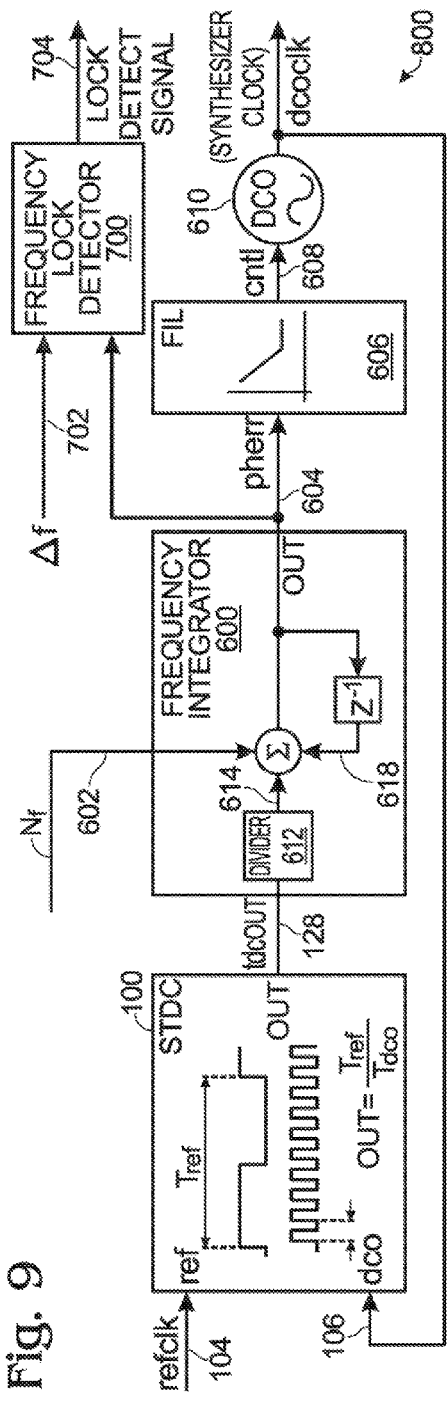
FIG. 9 is an alternate depiction of the DPLL of FIG. 8, implemented in a divider-less fractional-N digital PLL (DFN-PLL) block diagram.

FIG. 9 is an alternate depiction of the DPLL of FIG. 8, implemented in a divider-less fractional-N digital PLL (DFN-PLL) block diagram. A reference clock, refclk, serves as an input to the device. dcoclk, a clock with a frequency $N_F$ times the reference serves as the output, where $N_F$ can be an integer or fraction. The STDC 100 measures the ratio of Tref to Taco. The output is in the form of a digital word. The STDC 100 samples the phase error and generates an output every rising edge of the refclk. This output represents the phase difference between refclk.

The quantity $PT_{ref}$-$PNT_{vco}$ can be expressed as pherr, such that:

$$PT_{ref} - PNT_{vco} = pherr_f - pherr_i$$

where $pherr_f$ and $Pherr_i$ are the initial and final pherr value after P refclk cycles. In general, Pherr cannot be obtained with infinite resolution due to limitation of TDC. Assuming the of Pherr to be $T_{ref}/R$, then due to limitation of TDC resolution is:

$$PT_{ref} - PNT_{vco} = pherr_f \pm \frac{T_{ref}}{2R} - pherr_i \pm \frac{T_{ref}}{2R}$$

It follows that:

$$PT_{ref} - PNT_{vco} = pherr_f - pherr_i \pm \frac{T_{ref}}{R}$$

In-lock and out-of-lock criteria: The in-lock criterion becomes:

$$\frac{\Delta f_{ppm, in\ lock}}{10^6} > \frac{|pherr_f - pherr_i| + \frac{T_{ref}}{R}}{PT_{ref}}$$

and $$\frac{\Delta f_{ppm, in\ lock}}{10^6} > \frac{|pherr_f - pherr_i|\frac{R}{T_{ref}} + 1}{PR}$$

Similarly, the out of lock criterion becomes:

$$\frac{\Delta f_{ppm,out\ of\ lock}}{10^6} < \frac{|pherr_f - pherr_i| - \frac{T_{ref}}{R}}{PT_{ref}}$$

and $$\frac{\Delta f_{ppm,out\ of\ lock}}{10^6} < \frac{|pherr_f - pherr_i|\frac{R}{T_{ref}} - 1}{PR}$$

FIG. 10 is an exemplary flowchart for frequency lock detection process. The process begins at Step 1000. In Step 1002 an out-of-lock condition is detected. In Step 1004 the previous pherr value is obtained. After waiting P periods in Step 1006, Step 1008 obtains the current pherr value and makes a measurement. If $\Delta f$ is out of tolerance, Step 1010 returns to Step 1004. Otherwise, the process continues to Step 1012, where an in-lock condition is declared. Steps 1014 through 1024 essentially repeat the process of Steps 1000 through 1012, beginning with the in-lock state.

FIG. 11 is a diagram depicting waveforms associated with out-of-lock detection. When the difference between the reference clock and synthesizer clock exceeds a pherr value of 111110, an out-of-lock condition is declared.

To account for jitter in the refclk and vcoclk, the algorithm can be modified with the resolution of Pherr increasing accordingly.

False Locking The frequency lock detector relies on monitoring the derivative of the phase offset to detect lock. However, if the VCO (DCO) has a very wide frequency range, using only the TDC information might cause the PLL (DPLL) to lock to a harmonic of the desired frequency (false lock). To avoid false lock, one option is to use information from a digital counter during the frequency acquisition. This counter (see FIG. 4, counter 400) can be turned off after initial lock to save power, and the lock detector relies on the STDC data to monitor the lock state.

Frequency Indication: In addition to a binary "lock" indication, the frequency lock detector can provide an indication of the actual frequency of the VCO clock. Reproducing the equations presented above:

$$\frac{\Delta f_{ppm}}{10^6} = \frac{pherr_f - pherr_i \pm \frac{T_{ref}}{R}}{PT_{ref}}$$

and, $$\frac{\Delta f_{ppm}}{10^6} = \frac{|T_{ref} - NT_{vco}|}{T_{ref}}$$

Yielding:

$$\frac{pherr_f - pherr_i \pm \frac{T_{ref}}{R}}{PT_{ref}} = \frac{|T_{ref} - NT_{vco}|}{T_{ref}}$$

$$pherr_f - pherr_i \pm \frac{T_{ref}}{R} = PT_{ref} - NPT_{vco}$$

$$T_{vco} = \frac{PT_{ref} - pherr_f + pherr_i \pm \frac{T_{ref}}{R}}{NP}$$

$$f_{vco} = \frac{NP}{PT_{ref} - (pherr_f - pherr_i) \pm \frac{T_{ref}}{R}}$$

$$\frac{NP}{PT_{ref} - (pherr_f - pherr_i) + \frac{T_{ref}}{R}} <$$

$$f_{vco} < \frac{NP}{PT_{ref} - (pherr_f - pherr_i) - \frac{T_{ref}}{R}}$$

And for large values of P, fvco can be approximated as:

$$f_{vco} \approx \frac{NP}{PT_{ref} - (pherr_f - pherr_i)}$$

For a given Pherr$_f$ and Pherr$_i$, the frequency deviation of refclk to the target vcoclk frequency can be estimated. This is useful for open loop calibration of a multi sub-band VCO, and/or debugging purposes.

Figure 12:
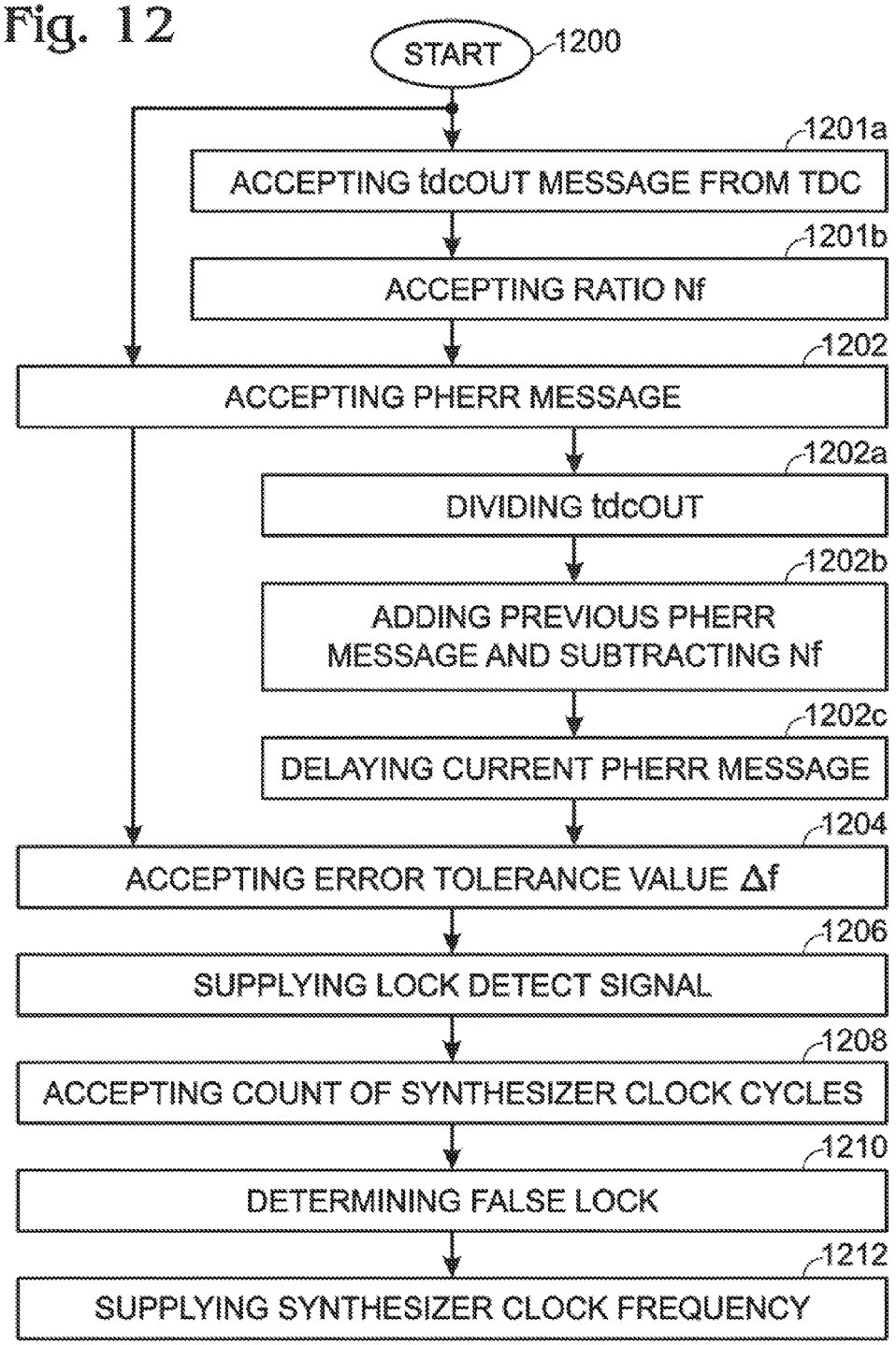
FIG. 12 is a flowchart illustrating a method for frequency lock detection using a digital phase error.
Figure 13:
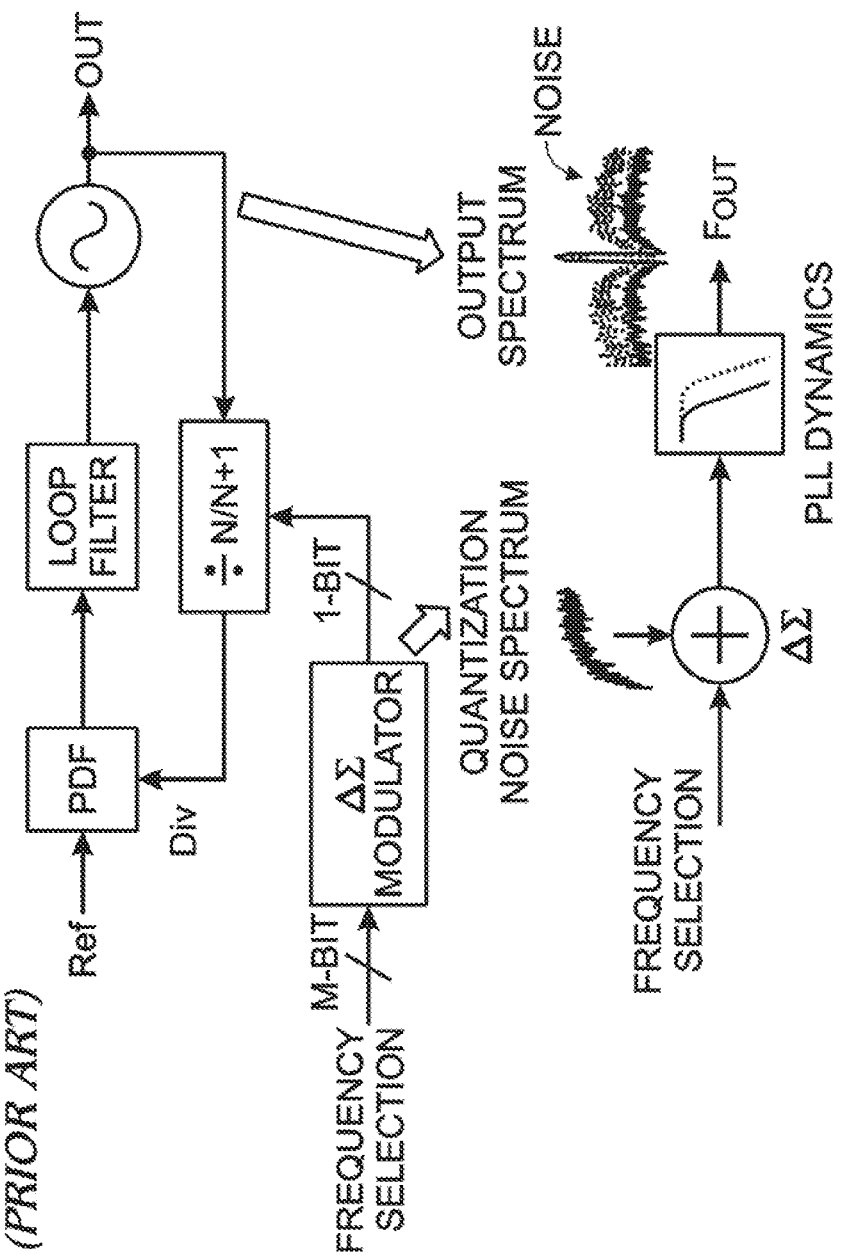
FIG. 13 is a schematic block diagram of a fractional-N digital PLL (prior art).

FIG. 12 is a flowchart illustrating a method for frequency lock detection using a digital phase error. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 1200.

In Step 1202 a lock detection module accepts a digital phase error (pherr) message proportional to an error in phase between a reference clock and a (synthesizer clock*Nf). Step 1204 accepts a unitless frequency error tolerance value (A h. Step 1206 periodically supplies a lock detect signal, indicating whether the synthesizer clock frequency is within the frequency error tolerance value of the reference clock frequency.

In one aspect, Step 1206 supplies an in-lock detect signal if:

$\Delta f > |pherr_f - pherr_i|/PTref$;

where pherr$_f$ is a final pherr value;
where Pherr$_i$ is an initial pherr value;

where P is a variable equal to an integer number of reference clock cycles;
where Tref is a period of a reference clock cycle.

In another aspect, Step 1202 accepts the pherr message with resolution uncertainty (Tref/R), and Step 1206 supplies the in-lock detect signal if:

$\Delta f > (|pherr_f - pherr_i| + (Tref/R))/PTref$;

$> (|pherr_f - pherr_i|R/Tref+1)/PR$.

Alternatively, Step 1206 supplies an out-of-lock detect signal if:

$\Delta f < (|pherr_f - pherr_i| - (Tref/R))/PTref$;

$< (|pherr_f - pherr_i|R/Tref-1)/PR$.

In one aspect, Step 1208 accepts a count of the number of frequency synthesizer clock cycles per reference clock cycle (HSCNTROUT). Step 1210 determines a false lock condition if:

$\Delta f > |pherr_f - pherr_i|/PTref$; and,

HSCNTROUT≠(Nf≠x), where x is a tolerance variable.

In another aspect, Step 1212 supplies a synthesizer clock frequency (Fvco) as follows:

$Fvco \approx (NfP)/(PTref-(pherr_f-pherr_i))$.

In one aspect, in Step 1201*a* a frequency integrator periodically accepts a digital tdcOUT message from a Time-to-Digital Converter (TDC) representing a measured ratio of a reference clock (Tref) period to a synthesizer clock (Tdco) period. Step 1201*b* accepts a digital message selecting a first ratio (Nf). Then, accepting the pherr message includes periodically accepting the pherr message from the frequency integrator.

In another aspect, accepting the pherr message in Step 1202 includes the frequency integrator performing the following substeps. Step 1202*a* divides the tdcOUT messages to supply divided tdcOUT (1/tdcOUT) messages. Step 1202*b* adds a previous pherr message pherr[k−1] to the divided tdcOUT message and subtracts Nf, to supply a current period pherr message (pherr[k]). Step 1202*c* delays the current pherr message, to supply the previous pherr message in a subsequent time period.

More explicitly, accepting the pherr message in Step 1202 includes the frequency integrator calculating a period difference (err) value as follows:

$$\frac{err[k]}{Tref} = \frac{T_{div}}{Tref} + \frac{err[k-1]}{Tref} - 1$$

$$\frac{err[k]}{Tref} = \frac{Nf \times T_{dco}}{out[k] \times T_{dco}} + \frac{err[k-1]}{Tref} - 1$$

$$\frac{err[k]}{Tref} = \frac{Nf}{out[k]} + \frac{err[k-1]}{Tref} - 1$$

pherr[k]=err[k]/Tref;

pherr[k]=Nf/out[k]+pherr[k−1]−1;

pherr[k]=Nf(1/out[k])+pherr[k−1]/Nf−Nf;

where T div is the period of (synthesizer clock*Nf); and,
where k is a time sequence value.

A system and method have been provided for using a STDC and a digital frequency integrator to create a digital phase error word, representing the ratio between a phase-locked loop PLL frequency synthesizer signal and a reference clock, which is used to generate a lock detect signal. Explicit examples of circuit typologies have been given to illustrate the invention, but the invention is not necessarily limited to just these examples. Other variations and embodiments of the invention will occur to those skilled in the art.

We claim:

1. A frequency lock detector using a digital phase error comprising:
    a first input to periodically accept a digital phase error (pherr) message proportional to an error in phase between a reference clock and a (synthesizer clock*Nf);
    a second input to accept a unitless frequency error tolerance value ($\Delta f$); and,
    an output to periodically supply a lock detect signal, indicating whether the synthesizer clock frequency is within the frequency error tolerance value of the reference clock frequency.

2. The frequency lock detector of claim 1 wherein the output supplies an in-lock detect signal as follows:

$\Delta f$>pherr$_f$−pherr$_i$/PTref;

where pherr$_f$ is a final pherr value;
    where pherr$_i$ is an initial pherr value;
    where P is a variable equal to an integer number of reference clock cycles; and,
    where Tref is a period of a reference clock cycle.

3. The frequency lock detector of claim 2 wherein the first input receives the pherr message with resolution uncertainty (Tref/R); and,
    wherein the output supplies the in-lock detect signal as follows:

$\Delta f$>(|pherr$_f$−pherr$_i$|+(Tref/R))/PTref;

>|pherr$_f$−pherr$_i$|R/Tref+1)/PR.

4. The frequency lock detector of claim 3 wherein the output supplies an out-of-lock detect signal as follows:

$\Delta f$<(|pherr$_f$−pherr$_i$|−(Tref/R))/PTref;

<(|pherr$_f$−pherr$_i$|R/Tref−1)/PR.

5. The frequency lock detector of claim 2 further comprising:
    a third input to receive a count of the number of frequency synthesizer clock cycles per reference clock cycle (HSCNTROUT); and,
    wherein the frequency lock detector determines a false lock condition if:

$\Delta f$>pherr$_f$−pherr$_i$/PTref; and,

HSCNTROUT≠(Nf≠x), where x is a tolerance variable.

6. The frequency lock detector of claim 3 further comprising:
    a frequency output to supply a synthesizer clock frequency (Fvco) as follows:

Fvco≈(NfP)/(PTref−(pherr$_f$−pherr$_i$)).

7. The frequency lock detector of claim 1 further comprising:
    a frequency integrator including:
        a first input to periodically accept a digital tdcOUT message from a Time-to-Digital Converter (TDC) representing a measured ratio of a reference clock (Tref) period to a synthesizer clock (Tdco) period;
        a second input to accept a digital message selecting a first ratio (Nf); and,
        an output to periodically supply the digital phase error (pherr) message.

8. The frequency lock detector of claim 7 wherein the frequency integrator further comprises:
    a divider to accept the tdcOUT messages and to supply divided tdcOUT (1/tdcOUT) messages;
    a summing module having inputs to accept the divided tdcOUT messages, the first ratio Nf, and a previous pherr message (pherr[k−1]), the summing module adding pherr[k−1] to the divided tdcOUT message and subtracting Nf to supply a current period pherr message (pherr [k]); and,
    a delay having an input to accept the current pherr message and an output to supply the previous pherr message in a subsequent time period.

9. The frequency lock detector of claim 8 wherein the frequency integrator calculates a period difference (err) value as follows:

$$\frac{err[k]}{Tref} = \frac{T_{div}}{Tref} + \frac{err[k-1]}{Tref} - 1$$

$$\frac{err[k]}{Tref} = \frac{Nf \times T_{dco}}{out[k] \times T_{dco}} + \frac{err[k-1]}{Tref} - 1$$

$$\frac{err[k]}{Tref} = \frac{Nf}{out[k]} + \frac{err[k-1]}{Tref} - 1$$

where T div is the period of (synthesizer clock*Nf);
where k is a time sequence value; and,
wherein the output supplies the pherr message as follows:

pherr[k]=err[k]/Tref;

pherr[k]=Nf/out[k]+pherr[k−1]−1;

pherr[k]=Nf(1/out[k])+pherr[k−1]/Nf−Nf.

10. The frequency lock detector of claim 1 wherein the second input accepts a frequency error tolerance value ($\Delta f$) as follows:

$\Delta f$=(Fvco−Ftarget)/Ftarget;

where Ftarget=Nf/Tref.

11. A digital phase-locked loop (DPLL) with a frequency lock detector, the DPLL comprising:
    a successive time-to-digital converter (STDC) having an input to accept a reference clock, an input to accept a synthesizer clock from a frequency synthesizer, and an output to periodically supply a digital tdcOUT message representing a measured ratio of the reference clock (Tref) period to the synthesizer clock (Tdco) period;
    a frequency integrator having a first input to accept the tdcOUT messages, a second input to accept a digital message selecting a first ratio (Nf), and an output to periodically supply a digital phase error (pherr) message proportional to an error in phase between reference clock and the (synthesizer clock*Nf);
    a digital loop filter having an input to accept the pherr message and an output to periodically supply a digital control message;
    a digitally controlled oscillator having an input to accept the control messages and an output to supply the synthesizer clock in response to the control messages; and,
    frequency lock detector including:
        a first input to periodically accept the digital phase error (pherr) message;
        a second input to accept a unitless frequency error tolerance value ($\Delta f$); and, an output to periodically supply a lock detect signal, indicating whether the synthesizer clock frequency is within the frequency error tolerance value of the reference clock frequency.

12. The DPLL of claim 11 wherein the frequency lock detector output supplies an in-lock detect signal as follows:

$\Delta f > |pherr_f - pherr_i|/PTref$;

where $pherr_f$ is a final pherr value;
where $pherr_i$ is an initial pherr value; and,
where P is a variable equal to an integer number of reference clock cycles.

13. A method for frequency lock detection using a digital phase error, the method comprising:
a lock detection module accepting a digital phase error (pherr) message proportional to an error in phase between a reference clock and a (synthesizer clock*Nf);
accepting a unitless frequency error tolerance value ($\Delta f$); and,
periodically supplying a lock detect signal, indicating whether the synthesizer clock frequency is within the frequency error tolerance value of the reference clock frequency.

14. The method of claim 13 wherein supplying the lock detect signal includes supplying an in-lock detect signal if:

$\Delta f > pherr_f - pherr_i/PTref$;

where $pherr_f$ is a final pherr value;
where $pherr_i$ is an initial pherr value;
where P is a variable equal to an integer number of reference clock cycles; and,
where Tref is a period of a reference clock cycle.

15. The method of claim 14 wherein accepting the pherr message includes accepting the pherr message with resolution uncertainty (Tref/R); and,
wherein supplying the in-lock detect signal includes supplying the in-lock detect signal if:

$\Delta f > (|pherr_f - pherr_i| + (Tref/R))/PTref$;

$> (|pherr_f - pherr_i|R/Tref + 1)/PR$.

16. The method of claim 15 wherein supplying the lock detect signal includes supplying an out-of-lock detect signal if:

$\Delta f < (|pherr_f - pherr_i| - (Tref/R))/PTref$;

$< (|pherr_f - pherr_i|R/Tref - 1)/PR$.

17. The method of claim 14 further comprising:
accepting a count of the number of frequency synthesizer clock cycles per reference clock cycle (HSCNTROUT); and,
determining a false lock condition if:

$\Delta f > |pherr_f - pherr_i|/PTref$; and,

HSCNTROUT$\neq$(Nf$\neq$x), where x is a tolerance variable.

18. The method of claim 15 further comprising:
supplying a synthesizer clock frequency (Fvco) as follows:

$Fvco \approx (NfP)/(PTref - (pherr_f - pherr_i))$.

19. The method of claim 13 further comprising:
a frequency integrator periodically accepting a digital tdcOUT message from a Time-to-Digital Converter (TDC) representing a measured ratio of a reference clock (Tref) period to a synthesizer clock (Tdco) period;
accepting a digital message selecting a first ratio (Nf); and,
wherein accepting the pherr message includes periodically accepting the pherr from the frequency integrator.

20. The method of claim 19 wherein accepting the pherr message includes the frequency integrator:
dividing the tdcOUT messages to supply divided tdcOUT (1/tdcOUT) messages;
adding a previous pherr message pherr[k−1] to the divided tdcOUT message and subtracting Nf, to supply a current period pherr message (pherr[k]); and,
delaying the current pherr message, to supply the previous pherr message in a subsequent time period.

21. The method of claim 20 wherein accepting the pherr message includes the frequency integrator calculating a period difference (err) value as follows:

$$\frac{err[k]}{Tref} = \frac{T_{div}}{Tref} + \frac{err[k-1]}{Tref} - 1$$

$$\frac{err[k]}{Tref} = \frac{Nf \times T_{dco}}{out[k] \times T_{dco}} + \frac{err[k-1]}{Tref} - 1$$

$$\frac{err[k]}{Tref} = \frac{Nf}{out[k]} + \frac{err[k-1]}{Tref} - 1$$

pherr[k]=err[k]/Tref;

pherr[k]=Nf/out[k]+pherr[k−1]−1;

pherr[k]=Nf(1/out[k])+pherr[k−1]/Nf−Nf;

where Tdiv is the period of (synthesizer clock*Nf); and,
where k is a time sequence value.

22. A frequency lock detector using a digital phase error comprising:
a means for periodically accepting a digital phase error (pherr) message proportional to an error in phase between a reference clock and a (synthesizer clock*Nf);
a means for accepting a unitless frequency error tolerance value ($\Delta f$); and,
a means for periodically supplying a lock detect signal, indicating whether the synthesizer clock frequency is within the frequency error tolerance value of the reference clock frequency.

* * * * *